(12) United States Patent
Sun et al.

(10) Patent No.: US 10,992,501 B1
(45) Date of Patent: Apr. 27, 2021

(54) EYE MONITOR FOR PARALLELIZED DIGITAL EQUALIZERS

(71) Applicant: CREDO TECHNOLOGY GROUP LIMITED, Grand Caymen (KY)

(72) Inventors: Junqing Sun, Fremont, CA (US); Haoli Qian, Fremont, CA (US)

(73) Assignee: CREDO TECHNOLOGY GROUP LIMITED, Grand Caymen (KY)

( * ) Notice: Subject to any disclaimer, the term of this patent is extended or adjusted under 35 U.S.C. 154(b) by 0 days.

(21) Appl. No.: 16/836,553

(22) Filed: Mar. 31, 2020

(51) Int. Cl.
*H04L 25/03* (2006.01)
*H03L 7/081* (2006.01)

(52) U.S. Cl.
CPC ........ *H04L 25/03878* (2013.01); *H03L 7/081* (2013.01)

(58) Field of Classification Search
CPC ................... H04L 25/03878; H03L 7/081
See application file for complete search history.

(56) References Cited

U.S. PATENT DOCUMENTS

| | | | |
|---|---|---|---|
| 4,686,488 A | 8/1987 | Attenborough | |
| 5,768,268 A | 6/1998 | Kline | |
| 5,943,369 A | 8/1999 | Knutson | |
| 6,509,773 B2 | 1/2003 | Buchwald et al. | |
| 6,654,432 B1 | 11/2003 | O'Shea | |
| 6,678,842 B1 | 1/2004 | Shaffer | |
| 7,049,937 B1 | 5/2006 | Zweig | |
| 7,058,150 B2 | 6/2006 | Buchwald et al. | |
| 7,151,430 B2 | 12/2006 | Mattsson | |
| 7,295,644 B1 | 11/2007 | Wu et al. | |
| 7,363,563 B1 | 4/2008 | Hissen | |
| 7,401,985 B2 | 7/2008 | Aronson | |
| 7,777,576 B2 | 8/2010 | Waheed | |
| 7,786,913 B2 | 8/2010 | Waheed | |

(Continued)

FOREIGN PATENT DOCUMENTS

| | | |
|---|---|---|
| CN | 104584152 A | 4/2015 |
| CN | 109495106 A | 3/2019 |

OTHER PUBLICATIONS

International Search Report and Written Opinion dated Jan. 11, 2018 in PCT/CN2017/79880.

(Continued)

*Primary Examiner* — Dac V Ha
(74) *Attorney, Agent, or Firm* — Ramey & Schwaller LLP; Daniel J. Krueger

(57) ABSTRACT

An illustrative integrated receiver circuit embodiment includes: a set of analog-to-digital converters that sample a receive signal in response to staggered clock signals to provide a parallel set of sampled receive signals; an equalizer that converts the parallel set of sampled receive signals into a parallel set of equalized signals; one or more quantizers that derives symbol decisions from the parallel set of equalized signals; a digital timing circuit that generates the staggered clock signals based on the parallel set of equalized signals; and a clock skew adjustment circuit that provides a controllable skew of at least one of said staggered clock signals relative to at least one other of the staggered clock signals. A monitor circuit is included to provide a reliability indicator for the symbol decisions, as is a controller that determines a dependence of the reliability indicator on the controllable skew.

20 Claims, 4 Drawing Sheets

(56) References Cited

U.S. PATENT DOCUMENTS

| | | | |
|---|---|---|---|
| 7,920,081 | B2 | 4/2011 | Waheed |
| 3,045,670 | A1 | 10/2011 | Waheed |
| 3,050,373 | A1 | 11/2011 | Buchwald |
| 3,050,375 | A1 | 11/2011 | Staszewski |
| 8,183,971 | B2 | 5/2012 | Le Guillou |
| 8,351,560 | B2 | 1/2013 | Buchwald |
| 8,686,776 | B2 | 4/2014 | Lim |
| 8,841,983 | B2 | 9/2014 | Newton |
| 8,917,124 | B1 | 12/2014 | Waltari |
| 9,177,709 | B2 | 11/2015 | Parthasarathy |
| 9,230,416 | B2 | 1/2016 | Ward |
| 9,322,704 | B1 | 4/2016 | Neveux |
| 9,385,859 | B2 | 7/2016 | Kuan |
| 9,432,176 | B2 | 8/2016 | Yu |
| 9,667,407 | B1 | 5/2017 | Liu |
| 9,800,438 | B1* | 10/2017 | Zhang ................... G01R 31/50 |
| 9,906,358 | B1 | 2/2018 | Tajalli |
| 9,935,800 | B1 | 4/2018 | He |
| 9,941,623 | B2 | 4/2018 | Lett |
| 10,084,623 | B1 | 9/2018 | Mactaggart |
| 10,211,994 | B2 | 2/2019 | Lin |
| 10,305,495 | B2 | 5/2019 | Behel |
| 10,313,105 | B2 | 6/2019 | Gao et al. |
| 10,313,165 | B2 | 6/2019 | Cheng |
| 10,389,515 | B1 | 8/2019 | Chien |
| 10,447,461 | B2 | 10/2019 | Barrenscheen |
| 10,447,509 | B1 | 10/2019 | Cai et al. |
| 10,483,910 | B2 | 11/2019 | Gao |
| 10,727,786 | B2 | 7/2020 | Gao |
| 2001/0055331 | A1 | 12/2001 | Agazzi |
| 2002/0039394 | A1 | 4/2002 | Buchwald et al. |
| 2004/0213337 | A1 | 10/2004 | Li |
| 2005/0169417 | A1 | 8/2005 | Amirichimeh |
| 2005/0207520 | A1 | 9/2005 | Su |
| 2005/0238126 | A1 | 10/2005 | Ribo |
| 2007/0246805 | A1 | 10/2007 | Zhang |
| 2007/0280341 | A1 | 12/2007 | Hidaka |
| 2007/0280342 | A1 | 12/2007 | Hidaka |
| 2007/0280383 | A1 | 12/2007 | Hidaka |
| 2007/0280384 | A1 | 12/2007 | Hidaka |
| 2007/0280389 | A1 | 12/2007 | Hidaka |
| 2007/0280390 | A1 | 12/2007 | Hidaka |
| 2007/0280391 | A1 | 12/2007 | Hidaka |
| 2007/0297209 | A1 | 12/2007 | Hidaka |
| 2007/0297248 | A1 | 12/2007 | Hidaka |
| 2007/0300119 | A1 | 12/2007 | Hidaka |
| 2008/0056344 | A1 | 3/2008 | Hidaka |
| 2008/0158034 | A1* | 7/2008 | Clark ............... H04B 10/25133 341/155 |
| 2008/0315928 | A1 | 12/2008 | Waheed |
| 2008/0315960 | A1 | 12/2008 | Waheed |
| 2008/0317187 | A1 | 12/2008 | Waheed |
| 2008/0317188 | A1 | 12/2008 | Staszewski |
| 2010/0283654 | A1 | 11/2010 | Waheed |
| 2011/0148676 | A1 | 6/2011 | Waheed |
| 2012/0044034 | A1 | 2/2012 | Nazarian |
| 2013/0149995 | A1 | 6/2013 | Guionnet |
| 2013/0294490 | A1 | 11/2013 | Knutson |
| 2013/0343400 | A1 | 12/2013 | Lusted |
| 2014/0086264 | A1 | 3/2014 | Lusted |
| 2014/0126613 | A1 | 5/2014 | Zhang |
| 2015/0003505 | A1 | 1/2015 | Lusted |
| 2015/0063514 | A1 | 3/2015 | Akita |
| 2015/0078495 | A1 | 3/2015 | Hossain |
| 2015/0207648 | A1* | 7/2015 | Palusa ................... H04L 25/03 375/233 |
| 2016/0013929 | A1 | 1/2016 | Takanashi |
| 2016/0337114 | A1 | 11/2016 | Baden |
| 2017/0099132 | A1* | 4/2017 | Lee ................ H04L 7/0062 |
| 2017/0310456 | A1 | 10/2017 | Tajalli |
| 2018/0083638 | A1 | 3/2018 | Tajalli |
| 2018/0083809 | A1 | 3/2018 | Tajalli |
| 2018/0115410 | A1 | 4/2018 | Tajalli |
| 2018/0138915 | A1 | 5/2018 | Jenkins |
| 2018/0219513 | A1 | 8/2018 | Gao |
| 2018/0343011 | A1 | 11/2018 | Tajalli |
| 2019/0007055 | A1 | 1/2019 | Nelson |
| 2019/0081772 | A1 | 3/2019 | Gao et al. |
| 2019/0198602 | A1 | 6/2019 | Liu |
| 2019/0386851 | A1 | 12/2019 | Dai |
| 2020/0028662 | A1 | 1/2020 | Brown |
| 2020/0044604 | A1 | 2/2020 | Gao |
| 2020/0076439 | A1 | 3/2020 | Weeks |
| 2020/0321967 | A1 | 10/2020 | Tajalli |

OTHER PUBLICATIONS

Yang, Ching-Yuan; A High-Frequency CMOS Multi-Modulus Divider for PLL Frequency Synthesizers; Analog Integr Circ Sig Process; 2008; pp. 155-162; vol. 55; Springer Science+Business Media, LLC.

Non-Final Office Action dated Jan. 24, 2018 in U.S. Appl. No. 15/487,045.

International Search Report and Written Opinion dated May 9, 2017 in International Application No. PCT/CA2016/91836.

Non-Final Office Action dated Oct. 4, 2018 in U.S. Appl. No. 15/702,715.

Notice of Allowance dated Mar. 8, 2019 in U.S. Appl. No. 15/702,715.

Non-Final Office Action dated Jun. 26, 2020 in U.S. Appl. No. 16/748,594.

U.S. Appl. No. 16/552,927, filed Aug. 27, 2019, entitled "Serdes Pre-Equalizer Having Adaptable Preset Coefficient Registers".

U.S. Appl. No. 16/459,512, filed Jul. 1, 2019, entitled "Parallel Mixed-Signal Equalization for High-Speed Serial Link".

Non-Final Office Action dated Dec. 30, 2019 for U.S. Appl. No. 16/459,512.

U.S. Appl. No. 16/691,523, filed Nov. 21, 2019, entitled "Multi-Function Level Finder for Serdes".

* cited by examiner

FIG. 1
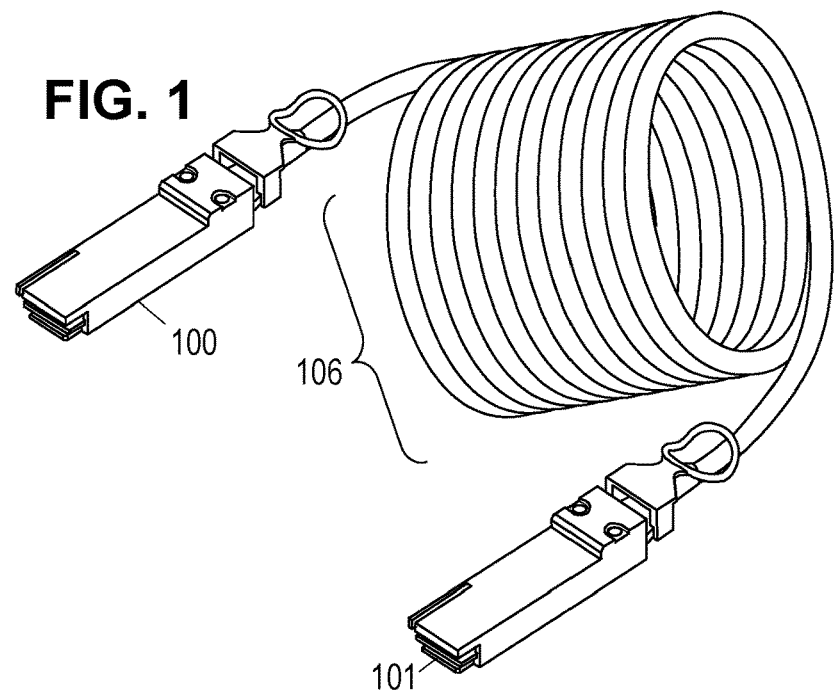
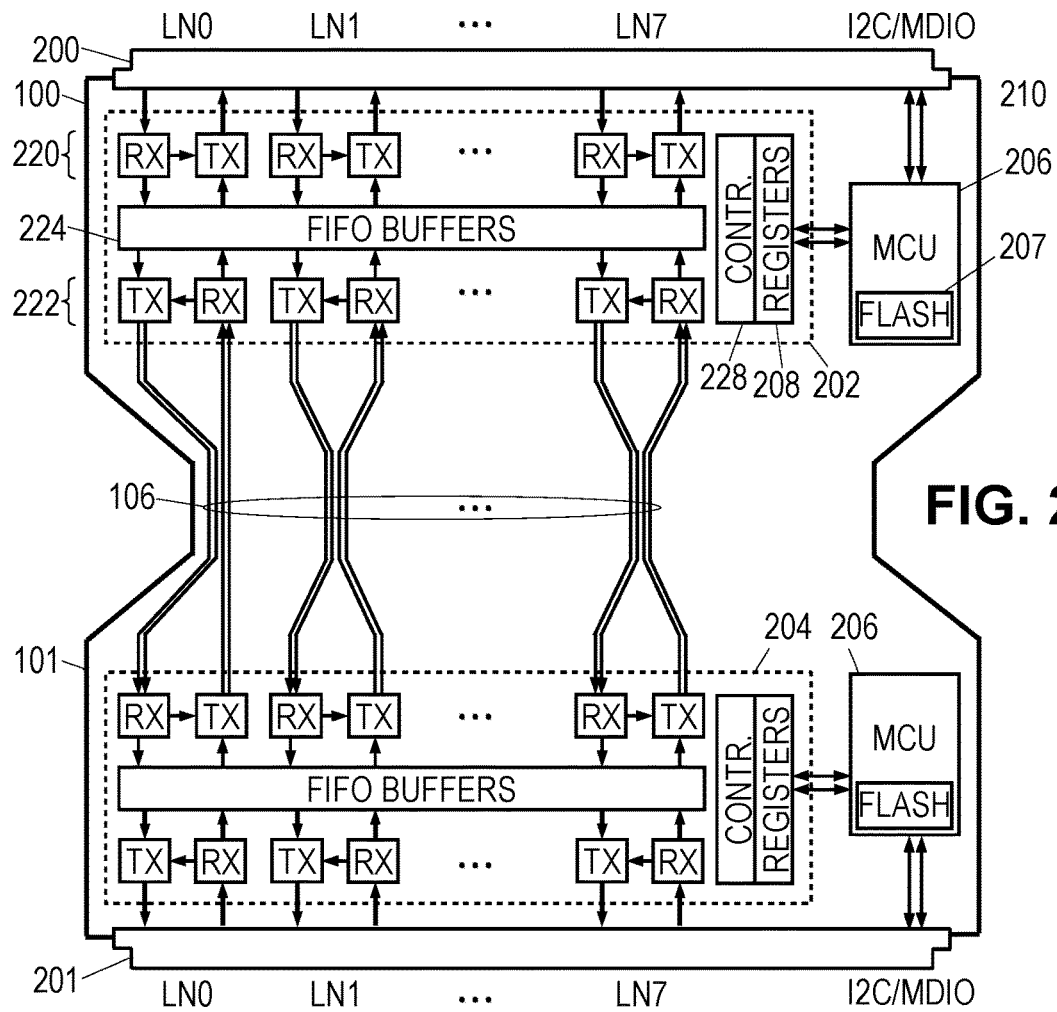
FIG. 2

EYE MONITOR FOR PARALLELIZED DIGITAL EQUALIZERS

BACKGROUND

Digital communications occur between sending and receiving devices over an intermediate communications medium, e.g., a fiberoptic cable or insulated copper wire, having one or more designated communications channels, e.g., carrier wavelengths or frequency bands. Each sending device typically transmits symbols at a fixed symbol rate, while each receiving device detects a potentially corrupted sequence of symbols and attempts to reconstruct the transmitted data.

A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by sequences of two or more symbols. The simplest digital communication links use only one bit per symbol; a binary '0' is represented by one symbol (e.g., an electrical voltage or current signal within a first range), and binary '1' by another symbol (e.g., an electrical voltage or current signal within a second range).

Channel non-idealities produce dispersion which may cause each symbol to perturb its neighboring symbols, causing intersymbol interference (ISO. As the symbol rate increases, ISI can make it difficult for the receiving device to determine which symbols were sent in each interval, particularly when such ISI is combined with additive noise. The open literature discloses many equalization and demodulation techniques for recovering digital data from the degraded receive signal even in the presence of ISI.

One technique for evaluating channels and equalization techniques is the "eye diagram", a representation of all possible paths the signal could follow within a given symbol interval, typically achieved via a superposition of many symbol intervals. Typically, the optimum sampling instant is near the mid-point of the symbol interval, where it is hoped that an opening can be found between the signal paths representing different symbol values. If such an opening exists, the transmitted symbol can be detected by a comparator that compares the sampled value to a decision threshold at the opening's center. The reliability of such decisions depends on the amount of noise relative to the distance between the decision threshold and the edges of the opening.

Often the eye diagram of a received signal has little or no opening, in which case an equalizer may be employed to create or increase the size of the opening relative to the average noise level. To evaluate receiver performance in such cases, it is often desirable to monitor the eye diagram of the equalized signal, i.e., the signal as it exists at the input to the symbol decision element. Such monitoring may be challenging for digital communications receivers operating in the tens-of-gigahertz range where integrated circuit implementations approach the physical limits of silicon-based device design.

SUMMARY

Accordingly, there is disclosed herein an eye monitor that exploits the structure of parallelized digital equalizers to enable monitoring without significantly increasing hardware requirements or complexity. An illustrative integrated receiver circuit embodiment includes: a set of analog-to-digital converters that sample a receive signal in response to staggered clock signals to provide a parallel set of sampled receive signals; an equalizer that converts the parallel set of sampled receive signals into a parallel set of equalized signals; one or more quantizers that derives symbol decisions from the parallel set of equalized signals; a digital timing circuit that generates the staggered clock signals based on the parallel set of equalized signals; and a clock skew adjustment circuit that provides a controllable skew of at least one of said staggered clock signals relative to at least one other of the staggered clock signals. A monitor circuit is included to provide a reliability indicator for the symbol decisions, as is a controller that determines a dependence of the reliability indicator on the controllable skew.

An illustrative method of manufacturing an integrated receiver circuit, includes patterning an integrated circuit substrate to provide the foregoing components.

An illustrative eye monitoring method includes: (a) operating a set of analog-to-digital converters in response to staggered clock signals to provide a parallel set of sampled receive signals; (b) filtering the parallel set of sampled receive signals to obtain a parallel set of equalized signals; (c) quantizing the parallel set of equalized signals to derive symbol decisions; (d) generating the staggered clock signals based on the parallel set of equalized signals; (e) controlling a skew of at least one of said staggered clock signals relative to at least one other of the staggered clock signals; (f) monitoring a reliability indicator for the symbol decisions; and (g) determining a dependence of the reliability indicator on the skew.

Each of the foregoing embodiments may be implemented individually or conjointly, and may be implemented with any one or more of the following features in any suitable combination: 1. the reliability indicator is a signal margin measurement. 2. the reliability indicator is a bit error rate. 3. the clock skew adjustment circuit provides a controllable skew of each of the staggered clock signals relative to at least one other of the staggered clock signals. 4. the controller sets the controllable skew for each of the staggered clock signals to optimize the reliability indicator. 5. the controller systematically sets the controllable skew to map the reliability indicator across a full width of a decision eye. 6. as part of generating the staggered clock signals, the digital timing circuit aligns transitions in the staggered clock signals with optimal sampling instants in the receive signal by iterative correction of estimated timing errors, the timing errors being estimated by combining the parallel set of equalized signals with the symbol decisions. 7. as part of said iterative correction, the digital timing circuit excludes those estimated timing errors that are dominated by said controllable skew. 8. the clock skew adjustment circuit controls a programmable delay line for the at least one of the staggered clock signals. 9. the clock skew adjustment circuit controls at least one phase offset of a phase interpolator, the at least one phase offset controlling a phase of the at least one of the staggered clock signals.

BRIEF DESCRIPTION OF THE DRAWINGS

FIG. 1 is a perspective view of an illustrative active Ethernet cable ("AEC").

FIG. 2 is a block diagram of an illustrative AEC.

DETAILED DESCRIPTION

Figure 3:
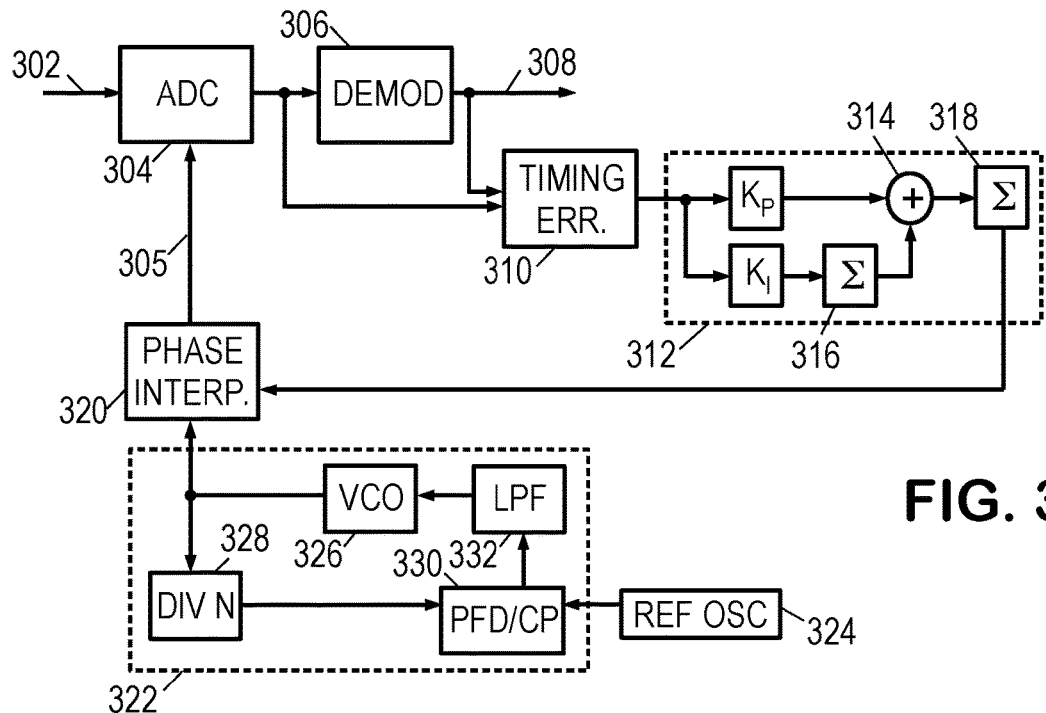
FIG. 3 is a block diagram of an illustrative digital communications receiver.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

FIG. 1 is a perspective view of an illustrative active Ethernet cable ("AEC") that may be used to provide a high-bandwidth communications link between devices in a routing network such as that used for data centers, server farms, and interconnection exchanges. The routing network may be part of, or may include, for example, the Internet, a wide area network, a local area network, or a storage area network. The linked devices may be computers, switches, routers, and the like. The cable includes a first connector 100 and a second connector 101 that are connected via electrical conductors 106 in a cord. The electrical conductors 106 may be arranged in a paired form such as with twinaxial conductors. (Twinaxial conductors can be likened to coaxial conductors, but with two inner conductors instead of one.) The inner conductors may be driven with a differential signal and their shared shield may operate to reduce crosstalk with other twinaxial conductors in the cable. Depending on the performance criteria, it may be possible to employ other paired conductor or single-ended conductor implementations.

Pursuant to the Ethernet standard, each conductor pair may provide unidirectional transport of a differential signal. To enable robust performance over even extended cable lengths (greater than, say, 3 m, 6 m, or 9 m), each connector 102, 104 may include a powered transceiver that performs clock and data recovery ("CDR") and re-modulation of data streams in each direction. Such powered transceivers are also known as data recovery and re-modulation ("DRR") devices. Notably, the transceivers perform CDR and re-modulation not only of the output data streams as they exit the cable, but also of the input data streams as they enter the cable.

The connectors 100, 101 may be pluggable modules compliant with any one of the pluggable module standards, e.g., SFP, SFP-DD, QSFP, QSFP-DD, OSFP. In at least one contemplated embodiment, the cable connectors 100, 101 are quad small form-factor pluggable ("QSFP") transceiver modules, and more specifically, QSFP28 transceiver modules, which exchange CAUI-4 data streams with the host. In other contemplated embodiments, the cable connectors are dual small form-factor pluggable ("DSFP") or small form-factor pluggable, double-density ("SFP-DD") transceiver modules, which exchange 100GBASE-KR2 data streams with the host. In still other contemplated embodiments, the cable connectors are different, such as with a QSFP28 to SFP-DD cable, a QSFP28 to DSFP cable, or a SFP-DD to DSFP cable.

FIG. 2 is a block diagram of an illustrative AEC. Connector 100 includes a plug 200 adapted to fit a standard-compliant Ethernet port in a first host device to receive an electrical input signal carrying a data stream from the host device and to provide an electrical output signal carrying a data stream to the host device. Similarly, connector 101 includes a plug 201 that fits an Ethernet port of a second host device. Connector 100 includes a first DRR device 202 to perform CDR and re-modulation of the data streams entering and exiting the cable at connector 100, and connector 101 includes a second DRR device 204 to perform CDR and re-modulation of the data streams entering and exiting the cable at connector 101. The DRR devices 202, 204 may be integrated circuits mounted on a printed circuit board and connected to edge connector contacts via circuit board traces. The electrical conductors 106 and shields may be soldered to corresponding pads on the printed circuit board that electrically connect to the DRR devices.

In at least some contemplated embodiments, the printed circuit boards each also support a micro-controller unit ("MCU") 206. Each DRR device 202, 204 is coupled to a respective MCU device 206 which configures the operation of the DRR device via a first two-wire bus. At power-on, the MCU device 206 loads equalization parameters and/or other operating parameters from Flash memory 207 into the DRR device's configuration registers 208. The host device can access the MCU device 206 via a second two-wire bus that operates in accordance with the I2C bus protocol and/or the faster MDIO protocol. With this access to the MCU device 206, the host device can adjust the cable's operating parameters and monitor the cable's performance.

Each DRR device 202, 204, includes a set 220 of transmitters and receivers for communicating with the host device and a set 222 of transmitters and receivers for sending and receiving via conductor pairs running the length of the cable. The cable-facing transceivers 222 preferably send and receive using differential NRZ at 26.5625 GBd in each direction over each lane, or using differential PAM4 at 26.5625 GBd in each direction over half as many lanes. To provide the desired range, it may be necessary to use larger cross-section copper wire for differential PAM4 signaling.

The illustrated host-facing transceivers 220 support eight lanes LN0-LN7 for bidirectional communication with the host device, each bidirectional lane formed by two unidirectional connections with differential PAM4 signaling at 26.5625 GBd, such as may be achieved with 400GBASE-KR8. In other contemplated embodiments, the host-facing transceivers 220 support four lanes using differential NRZ signaling in accordance with the CAUI-4 specification. The DRR devices include a memory 224 to provide first-in first-out (FIFO) buffering between the transmitter & receiver sets 220, 222. An embedded controller 228 coordinates the operation of the transmitters and receivers by, e.g., setting initial equalization parameters and ensuring the training phase is complete across all lanes and links before enabling the transmitters and receiver to enter the data transfer phase. The embedded controller 228 employs a set of registers 208 to receive commands and parameter values, and to provide responses potentially including status information and performance data.

In at least some contemplated embodiments, the host-facing transmitter and receiver set 220 employ fixed equalization parameters that are cable-independent, i.e., they are not customized on a cable-by-cable basis. The center-facing transmitter and receiver set 222 preferably employ cable-dependent equalization parameters that are customized on a cable-by-cable basis. The cable-dependent equalization parameters may be adaptive or fixed, and initial values for these parameters may be determined during manufacturer tests of the cable. The equalization parameters may include filter coefficient values for pre-equalizer filters in the transmitters, and gain and filter coefficient values for the receivers.

Figure 4:
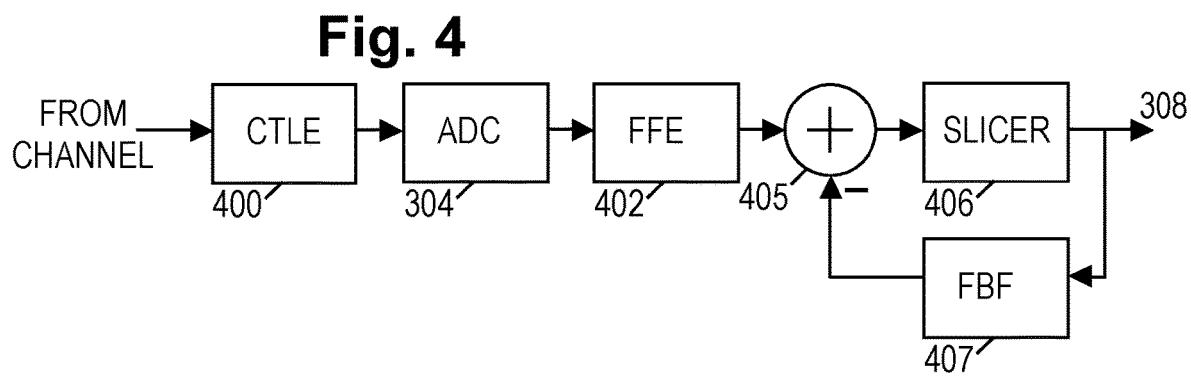
FIG. 4 is a block diagram of an illustrative decision feedback equalizer ("DFE").

Before describing the parallelized digital equalizer designs that may be preferred for each of the high-rate digital communications receivers of DRR devices 202, 204, it may be helpful to describe a non-parallel receiver design such as that shown in FIGS. 3 and 4.

As shown in FIG. 3, an illustrative digital receiver includes an analog-to-digital converter ("ADC") 304 that samples an analog receive signal 302 at sample times corresponding to transitions in a sampling clock signal 305, thereby providing a digital receive signal to a demodulator 306. The demodulator 306 applies equalization and symbol detection using, e.g., a matched filter, a decision feedback equalizer, or any other suitable demodulation technique. The resulting stream of demodulated symbols 308 may be processed in accordance with the relevant protocol to extract the relevant information from the data stream, e.g., including alignment, de-interleaving, error-correction, and descrambling operations.

The illustrative receiver includes a digital timing circuit to generate a suitable sampling clock signal 305. In FIG. 3, the digital timing circuit includes a timing error estimator 310 that combines the symbol decisions with the sampled signal (or more preferably, with the equalized signal) to generate timing error estimates. Suitable timing error estimation formulas can be found, e.g., in Mueller-Müller, "Timing Recovery in Digital Synchronous Data Receivers", IEEE Trans. Commun., v24 n5, May 1976. A timing loop filter 312 filters the estimated timing error signal to obtain a timing control signal for a phase interpolator 320. In the embodiment of FIG. 3, the timing loop filter 312 is a second order proportional-integration (PI) filter having a summer 314, which receives along a first path a proportional (i.e., scaled by a constant coefficient $k_p$) component of the timing error signal, and receives along a second path an integrated (i.e., scaled by a constant coefficient $k_I$ and integrated by integrator 316) component of the timing error signal. The received components are added and provided to a second integrator 318, which integrates the sum to provide the timing control signal to the phase interpolator 320.

The phase interpolator 320 also receives a clock signal from a phase lock loop (PLL) 322. The timing control signal causes the phase interpolator 320 to produce the sampling signal by adjusting the phase of the clock signal in a fashion that minimizes an expected value of the timing error. In other words, the timing control signal compensates for both the frequency offset and phase error of the clock signal relative to the analog data signal 302, thereby phase-aligning the sampling clock 305 with the data symbols in the analog receive signal.

The clock signal produced by PLL 322 is a frequency-multiplied version of a reference clock signal from reference oscillator 324. A voltage controlled oscillator ("VCO") 326 supplies the clock signal to both the phase interpolator 320 and to a counter 328 that divides the frequency of the clock signal by a constant or variable modulus N. The counter supplies the divided-frequency clock signal to a phase-frequency detector ("PFD") 330. PFD 330 may use a charge pump ("CP") as part of determining which input (i.e., the divided-frequency clock signal or the reference clock signal) has transitions earlier or more often than the other. A low pass filter 332 filters the output of PFD 330 to provide a control voltage to VCO 326. The filter coefficients are chosen so that the divided frequency clock becomes phase aligned with the reference oscillator.

Note that for at least some contemplated uses, the reference clock used by the receiver will often drift relative to the reference clock used by the transmitter, and may differ by hundreds of ppm. In the embodiment of FIG. 3, the resulting frequency offset between the PLL's clock signal output and the analog data signal would need to be corrected by continuous phase rotation in the phase interpolator 320. Other digital timing circuit implementations are available in the open literature, which would also be suitable for use in the disclosed embodiments.

FIG. 4 shows one illustrative implementation of the demodulator 306. Prior to sampling, the analog channel signal 302 is filtered by a continuous time linear equalizer ("CTLE") 400 to attenuate out-of-band noise and to optionally provide some spectral shaping to improve a response to high-frequency components of the receive signal. ADC 304 is provided to digitize the receive signal, and a digital filter (also known as a feed-forward equalizer or "FFE") 402 performs further equalization to further shape the overall channel response of the system and minimize the effects of leading ISI on the current symbol. As part of the shaping of the overall channel response, the FFE 402 may also be designed to shorten the channel response of the filtered signal while minimizing any attendant noise enhancement.

A summer 405 subtracts an optional feedback signal from the output of FFE 402 to minimize the effects of trailing ISI on the current symbol, yielding an equalized signal that is coupled to a decision element ("slicer") 406. The decision element includes one or more comparators that compare the equalized signal to corresponding decision thresholds to determine for each symbol interval which constellation symbol the signal's value most closely corresponds to. The equalized signal may also be termed a "combined signal" herein.

The decision element 406 accordingly produces a sequence of symbol decisions (denoted $A_k$, where k is the time index). In certain contemplated embodiments, the signal constellation is a bipolar (non-return-to-zero) constellation representing −1 and +1, necessitating only one comparator using a decision threshold of zero. In certain other contemplated embodiments, the signal constellation is PAM4 (−3, −1, +1, +3), necessitating three comparators employing the respective decision thresholds −2, 0, and +2. (The unit for expressing symbol and threshold values is omitted for generality, but for explanatory purposes may be presumed to be volts. In practice, a scale factor will be employed.) The comparator outputs can be taken collectively as a thermometer-coded digital representation of the output symbol decision, e.g., with 000 representing −3, 100 representing −1, 110 representing +1, and 111 representing +3. Alternatively, the comparator outputs could be converted into a binary or Gray-coded representation.

A feedback filter ("FBF") 407 derives the feedback signal using a series of delay elements (e.g., latches, flip flops, or registers) that store the recent output symbol decisions ($A_{k-1}$, $A_{k-2}$, ..., $A_{k-N}$, where N is the number of filter coefficients $f_i$). Each stored symbol is multiplied with a corresponding filter coefficient $f_i$, and the products are combined to obtain the feedback signal.

As an aside, we note here that the receiver also includes a filter coefficient adaptation unit, but such considerations are addressed in the literature and are well known to those skilled in the art. Nevertheless, we note here that at least some contemplated embodiments include one or more additional comparators in the decision element 406 to be employed for comparing the combined signal to one or more of the symbol values, thereby providing an error signal that can be used for timing recovery and/or coefficient adaptation.

Figure 5:
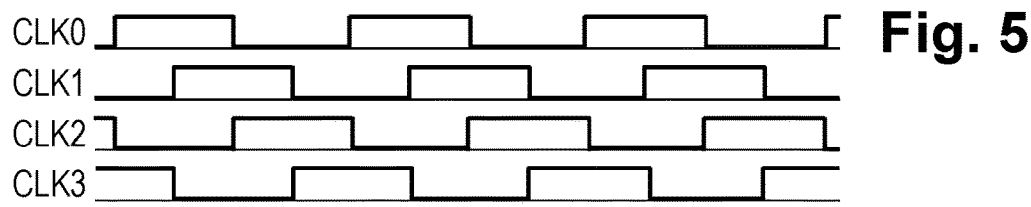
FIG. 5 is a graph of illustrative staggered clock signals.

As the symbol rates increase into the gigahertz range, it becomes increasingly difficult for the ADC 304 and demodulator 306 components to perform their required operations completely within each symbol interval, at which point it becomes advantageous to parallelize their operations. Parallelization generally involves the use of multiple components that share the workload by taking turns, and thereby providing more time for each of the individual components to complete their operations. Such parallel components are driven by a set of staggered clock signals such as those shown in FIG. 5. A four-fold parallelization employs a set of four clock signals, each having a frequency that is one-fourth of the symbol rate so that each symbol interval contains only one upward transition in the set of staggered clock signals. Though a four-fold parallelization is used for discussion purposes here, the actual degree of parallelization can be higher, e.g., 8-, 16-, 32-, or 64-fold. Moreover, the degree of parallelization is not limited to powers-of-two.

Figure 6:
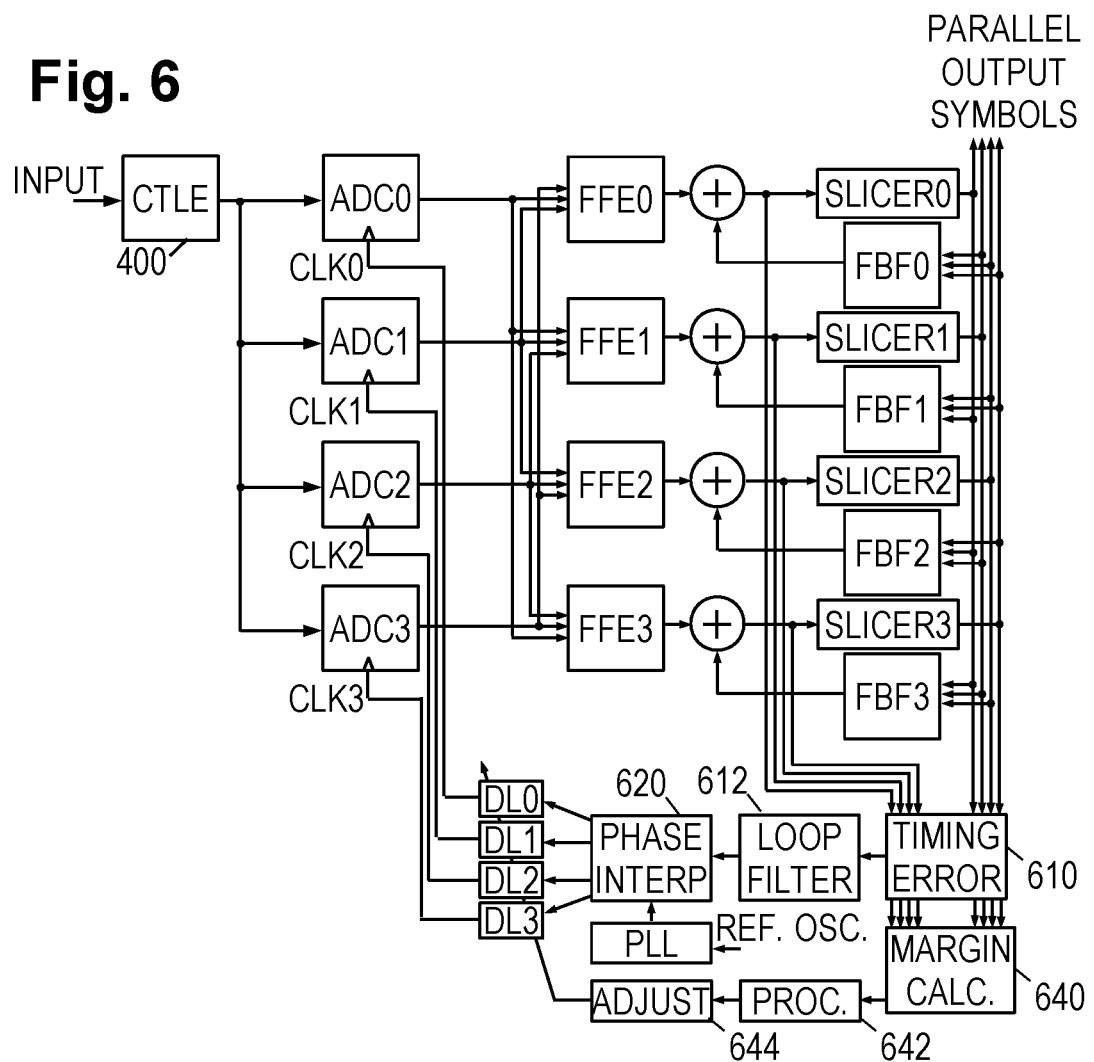
FIG. 6 is a block diagram of an illustrative parallelized DFE.

FIG. 6 shows an illustrative receiver having a parallelized equalizer implementation (including the optional feedback filters for DFE). As with the implementation of FIG. 4, the CTLE 400 filters the channel signal to provide a receive signal, which is supplied in parallel to an array of analog-to-digital converters (ADC0-ADC3). Each of the ADC elements is provided with a respective one of the staggered clock signals from FIG. 5. The clock signals have different phases, causing the ADC elements to take turns sampling and digitizing the receive signal, so that only one of the ADC element outputs is transitioning at any given time.

An array of FFEs (FFE0-FFE3), each forms a weighted sum of the ADC element outputs. The weighted sums employ filter coefficients that are cyclically shifted relative to each other. FFE0 operates on the held signals from ADC3 (the element operating prior to CLK0), ADC0 (the element responding to CLK0), and ADC1 (the element operating subsequent to CLK0), such that during the assertion of CLK2, the weighted sum produced by FFE0 corresponds to the output of FFE 402 (FIG. 4). FFE1 operates on the held signals from ADC0 (the element operating prior to CLK1), ADC1 (the element responding to CLK1), and ADC2 (the element operating subsequent to CLK1), such that during the assertion of CLK3, the weighted sum corresponds to that of FFE 402. And the operation of the remaining FFEs in the array follows the same pattern with the relevant phase shifts. In practice, the number of filter taps may be smaller, or the number of elements in the array may be larger, so as to offer a longer window of valid output.

As with the receiver of FIG. 4, a summer may combine the output of each FFE with a feedback signal to provide an equalized signal to a corresponding decision element. FIG. 6 shows an array of decision elements (Slicer0-Slicer3), each operating on an equalized signal derived from a respective FFE output. As with the decision element of FIG. 4, the illustrated decision elements employ comparators to determine which symbol the equalized signal most likely represents. The decisions are made while the respective FFE outputs are valid (e.g., Slicer0 operates while CLK2 is asserted, Slicer1 operates while CLK3 is asserted, etc.). Preferably the decisions are provided in parallel on an output bus to enable a lower clock rate to be used for subsequent operations.

An array of feedback filters (FBF0-FBF3) operates on the preceding symbol decisions to provide the feedback signals for the summers. As with the FFEs, the inputs for the FBFs are shifted cyclically and provide a valid output only when the inputs correspond to the contents of the FBF 407 (FIG. 4), coinciding with the time window for the corresponding FFE. In practice, the number of feedback filter taps may be smaller than what is shown, or the number of array elements may be larger, so as to offer a longer window of valid output.

As with the decision element of FIG. 4, the decision elements in FIG. 6 may each employ additional comparators to provide timing recovery info, coefficient training info, and/or precomputation to unroll one or more taps of the feedback filter. In the embodiment of FIG. 6, the digital timing circuit is also parallelized, with a timing error estimator 610 accepting symbol decisions and equalized signals in parallel to determine the timing error estimates that would be produced by estimator 310 (FIG. 3). A timing loop filter 612 generates the timing control signal that would be produced by filter 312, and the phase interpolator 620 operates similarly to phase interpolator 320 to convert the PLL clock signal into a set of staggered clock signals having evenly spaced phases with symbol-aligned transitions. A set of delay lines (DL0-DL3) is provided for fine-tuning the individual clock phases relative to each other as needed to, e.g., compensate for different propagation delays of individual ADC elements.

Figure 7:
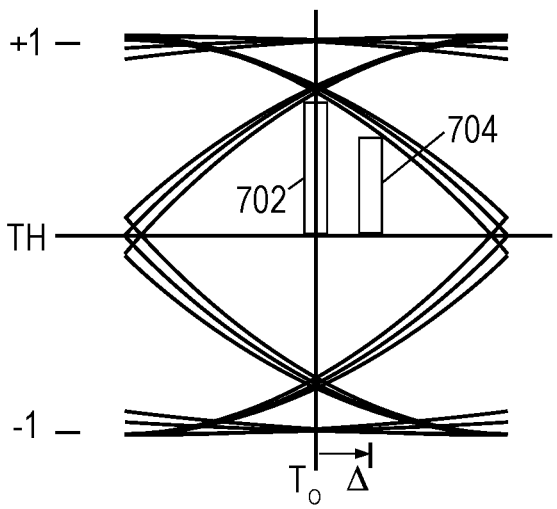
FIG. 7 is an illustrative eye diagram.

The delay lines may be individually adjusted by a clock skew adjustment circuit 644 based on parameters from a controller 642. The controller 642 may optimize the clock skew adjustment settings based on a reliability indicator from a monitor circuit. In FIG. 6, the monitor circuit is a margin calculator 640 that calculates the minimum difference between the equalized signal and the decision threshold (or equivalently, the maximum error between the equalized signal and the nominal symbol value). As shown in FIG. 7, the margin depends on the sampling instant. If sampling occurs at the optimal sampling time $T_O$, the equalized signal margin 702 is maximized. (The margin 702 is shown as a rectangle to account for timing jitter.) If a clock skew $\Delta$ delays the sampling instant, the equalized signal margin 704 is reduced (or equivalently the equalized signal error is increased).

To enable monitoring of changes to the margin, the margin calculator 640 may separately redetermine the minimum difference for each of a series of time windows, optionally determining a weighted average to smooth the margin measurements. And to further enable clock skew optimization for each of the staggered clocks, the margin calculator may separately track minimum differences for each ADC element within each time window.

Figure 8:
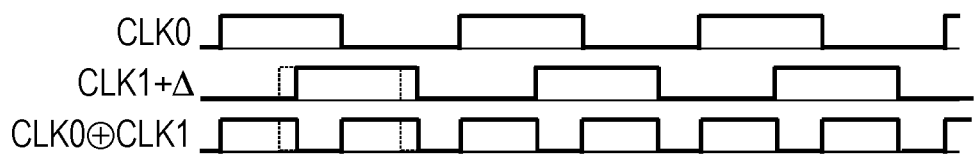
FIG. 8 is a graph of illustrative clock signals with skew adjustment.

One suitable technique for the clock skew adjustment circuit 644 to measure and control the skew between staggered clocks is illustrated in FIG. 8. FIG. 8 shows CLK1 being delayed by a skew $\Delta$ from its normal phase relative to CLK0, and further shows a combined signal derived from the two clocks with an exclusive-OR (or alternatively, with a logical OR) function. The duty cycle of the combined signal is a linear function of the skew $\Delta$.

Figure 9:
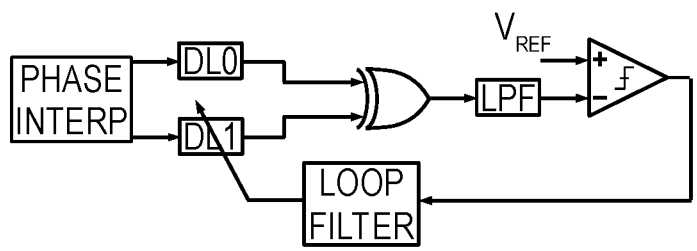
FIG. 9 is a block diagram of an illustrative clock skew adjustment circuit.

FIG. 9 is an illustrative embodiment of the clock skew adjustment circuit 644 using this skew measurement technique. An exclusive-OR gate derives the combined clock signal, and a low-pass filter ("LPF") measures the duty cycle of the combined clock signal. A comparator compares the duty cycle to a reference voltage ("Vref") provided by the controller, producing an error signal. A loop filter converts the error signal into a control signal for delay line DL1 to adjust the skew as needed to drive the error signal to zero.

The clock adjustment circuit 644 includes additional skew measurement and control loops to control the relative skew between each adjacent pair of staggered clock signals. Alternative embodiments of the clock skew adjustment circuit control the phase interpolator to adjust the relative phases of the staggered clock signals.

During normal operation, the digital timing loop aligns the sampling clock signals with the optimum sampling instants for the analog receive signal. Optionally, the controller 642 can fine-tune the relative skew of the staggered clock signals by determining the dependence of the signal margin (or another signal quality indicator) on the relative skew. In one implementation, the controller can perform a small skew adjustment having a given sign and, if the signal quality decreases, the controller can reverse the sign for subsequent skew adjustments.

However, the signal quality at other sampling instants is valuable for diagnosing performance issues, evaluating channels, and characterizing jitter tolerance. Eye monitoring involves measuring signal quality over a range of sampling phases within the channel symbol interval. Ideally, the range spans the width of the eye opening in the eye diagram, but smaller ranges can often be sufficient to characterize channel performance as a function of jitter. Conversely, jitter tolerance can be determined for a given channel performance, whether specified in terms of signal-to-noise ratio, signal margin, or bit error rate.

As it is impractical to operate the ADC elements of high rate receivers quickly enough to obtain multiple samples in a given symbol interval, and undesirably expensive to provide additional ADC elements, it is proposed herein to deliberately vary the relative skew of at least one of the staggered clock signals to sample at different phases within every nth channel symbol interval, where n is the number of ADC elements. To prevent the samples acquired with the skewed clock signal from disrupting the performance of the digital timing loop, the timing error estimator 610 may be configured to exclude or suppress the timing error estimates derived from those samples. So long as there are sufficiently many timing error estimates in each cycle, more than one of the clock signals may be skewed to enable faster measurement of the eye opening.

Note that the samples acquired with the skewed clock signal will degrade the performance of the FFE elements operating on those samples, but this degradation is expected to be "graceful degradation", i.e., gradual, controlled degradation. However, a potential issue for decision feedback equalizers is error propagation via the FBF elements, which makes the degradation potentially sudden and unpredictable. This issue can be avoided by minimizing the magnitude of FBF taps associated with symbol decisions that are strongly dependent on the skewed clock samples. In some implementations, the FBF elements may be entirely disabled.

Figure 10:
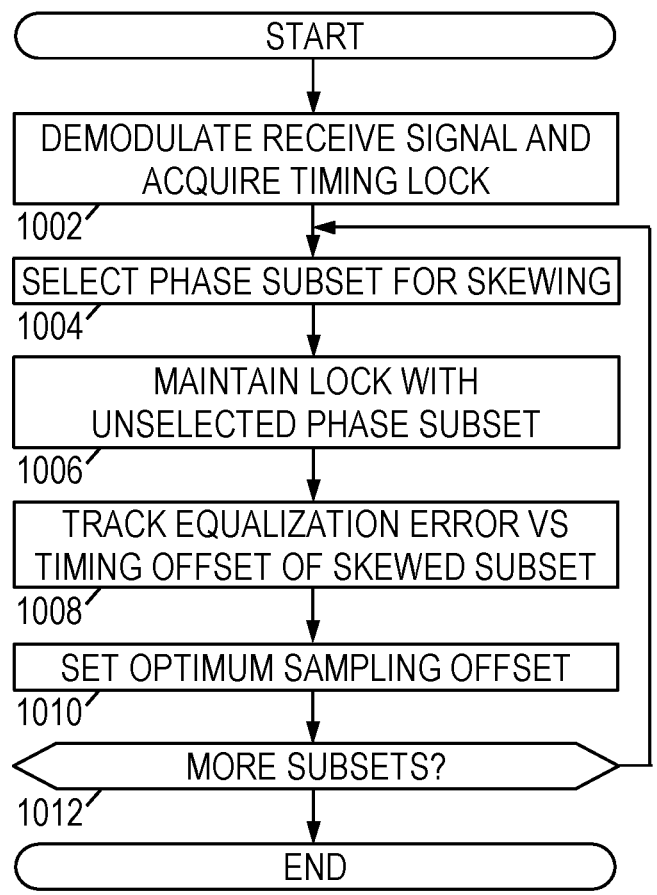
FIG. 10 is a flow diagram of an illustrative eye monitoring method.

FIG. 10 shows an illustrative eye monitoring method that may be implemented by the receiver of FIG. 6. Initially, in block 1002, the receiver operates normally to digitize and demodulate the receive signal, with the digital timing loop operating to synchronize the staggered clock signals with the optimum sampling instants of the symbol intervals in the receive signal. After the digital timing loop has locked in to the optimum timing, the controller selects in block 1004 which one or more of the staggered clock signals will be skewed to map the eye opening and, by implication, which of the staggered clock signals will remain at the optimum sampling phase and continue to be employed for maintaining the timing lock. In at least some embodiments, the controller iterates through each of the staggered clock signals, performing the eye monitoring and phase optimization for each of the clock signals in turn.

In block 1006, the controller configures the timing error estimator to exclude or suppress estimates that depend on samples acquired using the skewed clock signals, maintaining the timing lock using only the unskewed clock signals.

In block 1008, the controller systematically varies the skew of the selected clock signals to determine the signal margin and/or other indicators of symbol decision reliability as a function of the skew amount. In some embodiments, the skew range spans the full eye opening. In other contemplated embodiments, the skew range is limited to whatever degree is needed to reduce the signal margin (or signal to noise ratio, or another reliability indicator) below a predetermined value.

In block 1010, the controller analyzes the dependence of the reliability indicator on skew to determine the optimum skew value for the selected clock signal(s). In block 1012, the controller determines whether each of the clock signals have been selected and optimized, and if not, the method repeats blocks 1004-1012. Once each of the clock signal skew have been optimized, the method completes.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. An integrated receiver circuit that comprises:
   a set of analog-to-digital converters that sample a receive signal in response to staggered clock signals to provide a parallel set of sampled receive signals;
   an equalizer that converts the parallel set of sampled receive signals into a parallel set of equalized signals;
   one or more quantizers that derives symbol decisions from the parallel set of equalized signals;
   a digital timing circuit that generates the staggered clock signals based on the parallel set of equalized signals;
   a clock skew adjustment circuit that provides a controllable skew of at least one of said staggered clock signals relative to at least one other of the staggered clock signals;
   a monitor circuit that provides a reliability indicator for the symbol decisions; and
   a controller that determines a dependence of the reliability indicator on the controllable skew.

2. The integrated receiver circuit of claim 1, wherein the reliability indicator is a signal margin measurement.

3. The integrated receiver circuit of claim 1, wherein the reliability indicator is a bit error rate.

4. The integrated receiver circuit of claim 1, wherein the controller sets the controllable skew to optimize the reliability indicator.

5. The integrated receiver circuit of claim 4, wherein the clock skew adjustment circuit provides a controllable skew of each of the staggered clock signals relative to at least one other of the staggered clock signals, and wherein the controller sets the controllable skew for each of the staggered clock signals to optimize the reliability indicator.

6. The integrated receiver circuit of claim 1, wherein the controller systematically sets the controllable skew to map the reliability indicator across a full width of a decision eye.

7. The integrated receiver circuit of claim 1, wherein as part of generating the staggered clock signals, the digital timing circuit aligns transitions in the staggered clock signals with optimal sampling instants in the receive signal by iterative correction of estimated timing errors, the timing errors being estimated by combining the parallel set of equalized signals with the symbol decisions.

8. The integrated receiver circuit of claim 7, wherein as part of said iterative correction, the digital timing circuit excludes those estimated timing errors that are dominated by said controllable skew.

9. The integrated receiver circuit of claim 1, wherein the clock skew adjustment circuit controls a programmable delay line for the at least one of the staggered clock signals.

10. The integrated receiver circuit of claim 1, wherein the clock skew adjustment circuit controls at least one phase offset of a phase interpolator, the at least one phase offset controlling a phase of the at least one of the staggered clock signals.

11. A method of manufacturing an integrated receiver circuit, the method comprising patterning an integrated circuit substrate to provide:
- a set of analog-to-digital converters that sample a receive signal in response to staggered clock signals to provide a parallel set of sampled receive signals;
- an equalizer that converts the parallel set of sampled receive signals into a parallel set of equalized signals;
- one or more quantizers that derives symbol decisions from the parallel set of equalized signals;
- a digital timing circuit that generates the staggered clock signals based on the parallel set of equalized signals;
- a clock skew adjustment circuit that provides a controllable skew of at least one of said staggered clock signals relative to at least one other of the staggered clock signals;
- a monitor circuit that provides a reliability indicator for the symbol decisions; and
- a controller that determines a dependence of the reliability indicator on the controllable skew.

12. The method of claim 11, further comprising: configuring the controller to set the controllable skew to optimize the reliability indicator.

13. The method of claim 12, wherein the clock skew adjustment circuit is configured to provide a controllable skew of each of the staggered clock signals relative to at least one other of the staggered clock signals, and wherein the controller is configured to set the controllable skew for each of the staggered clock signals to optimize the reliability indicator.

14. A method that comprises:
- operating a set of analog-to-digital converters in response to staggered clock signals to provide a parallel set of sampled receive signals;
- filtering the parallel set of sampled receive signals to obtain a parallel set of equalized signals;
- quantizing the parallel set of equalized signals to derive symbol decisions;
- generating the staggered clock signals based on the parallel set of equalized signals;
- controlling a skew of at least one of said staggered clock signals relative to at least one other of the staggered clock signals;
- monitoring a reliability indicator for the symbol decisions; and
- determining a dependence of the reliability indicator on the skew.

15. The method of claim 14, wherein the reliability indicator is a signal margin measurement.

16. The method of claim 14, wherein the reliability indicator is a bit error rate.

17. The method of claim 14, further comprising: setting the skew to optimize the reliability indicator.

18. The method of claim 14, wherein said determining includes mapping the dependence of the reliability indicator across a full width of a decision eye.

19. The method of claim 14, wherein said generating the staggered clock signals includes aligning transitions in the staggered clock signals with optimal sampling instants in the receive signal by iterative correction of estimated timing errors, the timing errors being estimated by combining the parallel set of equalized signals with the symbol decisions.

20. The method of claim 19, wherein said iterative correction employs only those estimated timing errors that are not dominated by said skew.

* * * * *